United States Patent [19]
Jones

[11] Patent Number: 5,198,070
[45] Date of Patent: Mar. 30, 1993

[54] JOINING DIAMOND BODIES

[76] Inventor: Barbara L. Jones, 80 Chisbury Close, Forest Park, Bracknell RG12 3TX, England

[21] Appl. No.: 660,544

[22] Filed: Feb. 25, 1991

Related U.S. Application Data

[63] Continuation-in-part of Ser. No. 411,100, Sep. 22, 1989, abandoned, which is a continuation-in-part of Ser. No. 343,912, Apr. 26, 1989, abandoned.

[30] Foreign Application Priority Data

Apr. 28, 1988 [GB] United Kingdom ............... 8810113

[51] Int. Cl.$^5$ ............................................. C30B 29/04
[52] U.S. Cl. ........................... 156/612; 156/DIG. 68; 423/446
[58] Field of Search ............. 423/446; 501/86; 427/39; 156/DIG. 68, 610, 612

[56] References Cited

U.S. PATENT DOCUMENTS

| | | | |
|---|---|---|---|
| 3,630,678 | 12/1971 | Gardner | 423/446 |
| 4,104,441 | 8/1978 | Feduseev et al. | 423/446 |
| 4,434,188 | 2/1984 | Kamo et al. | 427/113 |
| 4,534,773 | 8/1985 | Phaal et al. | 51/309 |

FOREIGN PATENT DOCUMENTS

| | | | |
|---|---|---|---|
| 763313 | 8/1971 | Belgium | 423/446 |
| 264024 | 4/1988 | European Pat. Off. | 423/446 |
| 62-138395 | 6/1987 | Japan | 423/446 |
| 62-167294 | 7/1987 | Japan | 423/446 |
| 62-226889 | 10/1987 | Japan | 423/446 |
| 1298369 | 11/1972 | United Kingdom | 423/446 |
| 1456314 | 11/1976 | United Kingdom | 423/446 |

OTHER PUBLICATIONS

English language abstract of JP 62-297299, published Dec. 24, 1987.

Primary Examiner—Robert Kunemund
Attorney, Agent, or Firm—Scully, Scott, Murphy & Presser

[57] ABSTRACT

A method of joining diamond bodies which includes the steps of positioning the bodies such that a surface of one body is close to a surface of the other body and a space is provided therebetween, growing diamond on the surfaces by chemical vapor deposition and continuing the growth until the surfaces are joined by grown diamond.

12 Claims, 2 Drawing Sheets

JOINING DIAMOND BODIES

CROSS-REFERENCE

This application is a continuation-in-part application of U.S. patent application Ser. No. 07/411,100, filed Sep. 22, 1989 now abandoned, which is a continuation-in-part application of U.S. patent application Ser. No. 343,912, filed Apr. 26, 1989, now abandoned.

BACKGROUND OF THE INVENTION

This invention relates to joining diamond bodies.

It is possible to synthesise diamond from the gas phase. This method is known as chemical vapour deposition (CVD) and the diamond produced is known as CVD diamond. The process generally involves providing a mixture of hydrogen gas and a suitable gaseous carbon compound such as a hydrocarbon, applying sufficient energy to that gas to dissociate the hydrogen into atomic hydrogen and the gas into active carbon ions, atoms or CH radicals and allowing such active species to deposit on a substrate to form diamond. Dissociation of the gases can take place by a variety of methods.

One such method is the use of a hot filament. In this method, the gas temperature at the filament is about 2000° C. and the substrate on which diamond growth occurs is at 800° to 1100° C.

A second commonly used method is a plasma assisted method. The hydrogen and gaseous carbon compound enter a plasma region, which may be microwave, RF or DC plasma, where they are excited to their reactive states. They diffuse in this state to a substrate. The substrate is heated by the plasma.

Yet a further method of exciting the hydrogen/gaseous carbon compound mixture is with the use of a plasma jet. One such method is described in EP 0286306 which involves effecting an arc discharge while feeding a discharge gas between an anode and a cathode of a thermal plasma chemical vapour deposition device, activating or producing radicals from a gaseous carbon compound by feeding the gaseous compound to a generated plasma jet and permitting the plasma jet containing the radicals to impinge on a substrate thereby to form diamond on the substrate.

SUMMARY OF THE INVENTION

According to the present invention, a method of joining diamond bodies includes the steps of positioning the bodies such that a surface of one body is close to a surface of the other body and a space is provided therebetween, growing diamond on the surfaces by chemical vapour deposition and continuing the growth until the surfaces are joined by grown diamond.

DESCRIPTION OF EMBODIMENTS OF THE INVENTION

The invention provides a method which creates a bonding diamond or diamond-like bridge between spaced diamond surfaces. This diamond or diamond-like bridge is produced using chemical vapour deposition techniques. Chemical vapour deposition, as is stated above, involves creating an atmosphere of a gaseous carbon compound around the surfaces, bringing the temperature of the surfaces to a suitable elevated temperature, typically at least 600° C., and subjecting the gaseous carbon compound to energy of such a nature as to cause the compound to decompose and produce carbon which deposits on the diamond surfaces. As the process continues, so the diamond growth increases, eventually creating the diamond or diamond-like bridge between the surfaces.

Typically, the space between the surfaces on which diamond growth occurs is such that, from the one surface to the other at its widest point, the distance or gap does not exceed 150 microns, generally no more than 75 microns. This space will generally be filled with the grown diamond.

The method of the invention can also be used to create bridges between discrete diamond particles thereby producing a bonded polycrystalline mass. The discrete diamond particles may be of synthetic or natural origin and will typically have a size of less than 500 microns.

Figure 1:
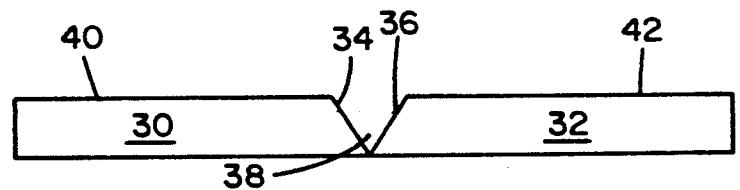
FIG. 1 illustrates schematically two diamond plates to be joined to each other.

The method of the invention can also be used to produce relatively large diamond plates of good quality. In this form of the invention, diamond plates or particles are provided, each of which may have an outer surface of one of the three well defined planes (100), (110) or (111) or within 3° of any one of these planes. Good crystalline epitaxial diamond growth can be produced on these surfaces. Bridging or bonding will take place between adjacent plates. Adjacent plates may have cooperating adjacent surfaces as illustrated by FIG. 1. Referring to this Figure, two plates 30, 32 have adjacent end surfaces 34, 36 cut away so that when the two plates are brought together and in contact with each other a V-shaped gap 38 is produced. Diamond growth will occur on the surfaces 34, 36 eventually bridging the gap 38.

The surfaces 34, 36 will ideally be such that the growth will occur thereon at a faster rate than on the top surfaces 40, 42. For example, if the surfaces 40 and 42 are defined by (100) planes, then the surfaces 34, 36, which are transverse thereto, are preferably roughened to provide at least one (111) plane or facet on each surface or are defined by a (111) plane or a (110) plane. Alternatively, if the surfaces 40, 42 are defined by (110) planes, then the surfaces 34, 36 are preferably roughened to provide at least one (111) plane or facet on each surface or are defined by a (111) plane.

Figure 2:
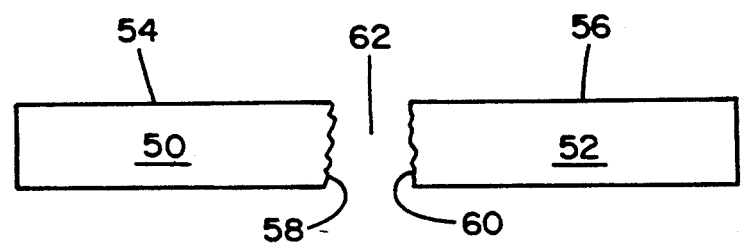
FIG. 2 illustrates schematically another embodiment of two diamond plates to be joined to each other.

FIG. 2 illustrates another embodiment of the invention. Referring to this figure, there are shown two plates 50 and 52 which have flat upper surfaces 54 and 56 and roughened transverse surfaces 58 and 60, respectively. The surfaces 58 and 60, are typically roughened by sawing or other fragmenting method. Each roughened surface will have a plurality of (111) planes or facets. Typically, the surfaces 54 and 56 will be defined by (100) or (110) planes. Diamond growth on the surfaces 58 and 60 will be far more rapid than diamond growth on the surfaces 54 and 56. The diamond growth will take place inwards from the surfaces 58 and 60 into the space 62.

In both embodiments of FIGS. 1 and 2, diamond growth will occur more rapidly in the space provided between the opposing surfaces 34, 36 and 58, 60. The diamond growth on each surface will continue until they are joined by grown diamond. Preferably, this growth is continued until the space is filled with grown diamond. The resulting product is a diamond body which can be used as a diamond window.

The invention preferably produces a bonding bridge or bond which is crystalline diamond in nature. The method which may be used to produce such a bridge includes the steps of placing the diamond surfaces on a suitable nitride surface, creating an atmosphere of gaseous carbon compound around the substrate, bringing the temperature of the nitride surface and the diamond surfaces to at least 600° C., and subjecting the gaseous carbon compound to microwave energy suitable to cause the compound to decompose and produce carbon which deposits on the surfaces and forms crystalline diamond thereon. Essential to this method is that the diamond surfaces are placed on suitable nitride surface.

The nitride surface, during the method, release nitrogen atoms in small amounts which create a suitable nitrogen concentration in the atmosphere surrounding the diamond surfaces slowing the diamond growth and hence improving it. This nitride surface will generally and preferably cover completely a support which is preferably a microwave energy sink, i.e. a support which will absorb microwave energy and thereby be heated. An example of such a support is a graphite support which will absorb at least 50% of the microwave energy. The nitride may be silicon nitride, aluminium nitride, titanium nitride, tantalum nitride or the like. The nitride surface will typically be formed on a support by means of known chemical vapour deposition methods. Such methods will result in the nitride containing substantial quantities of hydrogen, e.g. 1 to 30 atomic percent. The hydrogen will be strongly bonded. In the case of silicon nitride produced by this method, the nitride will typically have the formula:

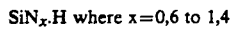

$SiN_x.H$ where $x = 0.6$ to $1.4$

The temperature of the nitride surface and the diamond surfaces are preferably maintained at a temperature of 600° to 1000° C. during the time the decomposition of the carbon compound and deposition of carbon on the diamond surfaces take place. The substrate will generally be at a higher temperature than the nitride surface. The microwave energy which is used to decompose the carbon compound will typically be the source of the heating energy for the surface.

The frequency of the microwave energy may vary over a wide range. Typically the frequency will be in the range 200 MHz to 90 GHz. An example of a typical frequency which may be used is 2,45 GHz. The microwave energy will typically be maintained for a period of at least several hours, e.g. 2 to 10 hours.

The gaseous carbon compound will preferably be introduced into a confined space containing the substrate. The compound may take the form of a mixture with a reducing gas such as hydrogen. Typically, the mixture will contain less than 5% by volume of the carbon compound. The carbon compound will generally be a suitable hydrocarbon such as methane. Examples of other suitable carbon compounds are ethane, propane, fluorinated hydrocarbons such as $CF_4$, $C_2F_6$ and $CHF_3$, carbon monoxide and carbon dioxide.

Figure 3:
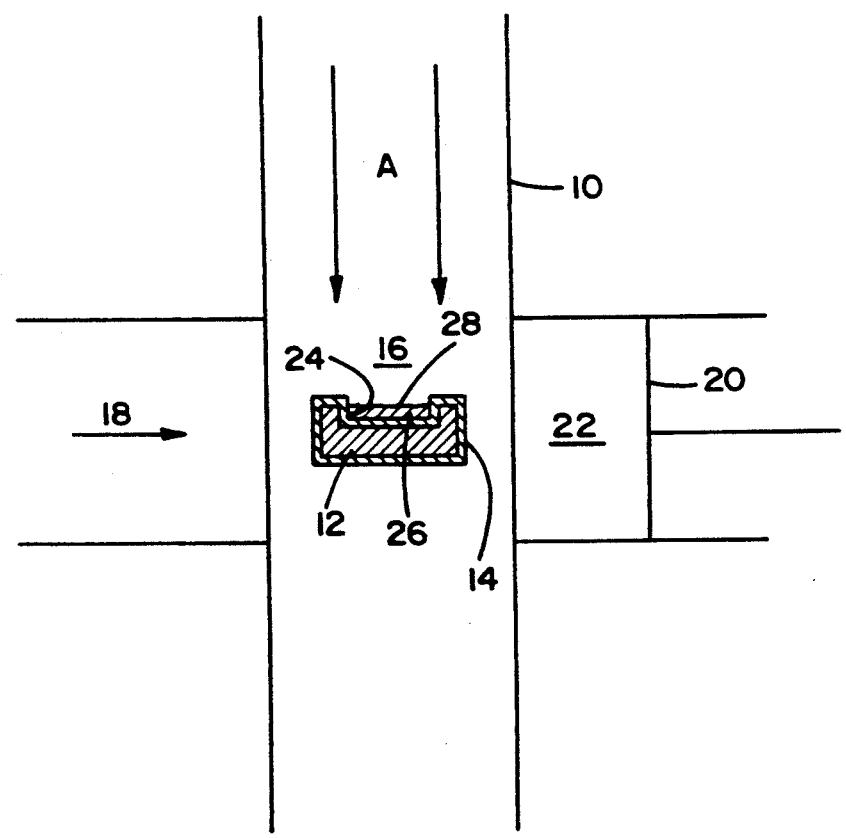
FIG. 3 illustrates schematically apparatus suitable for carrying out the method of the invention.

An example of apparatus for carrying out the above method will now be described with reference to FIG. 3 of the accompanying drawing. The apparatus consists of a quartz tube 10 in which is suspended one or more graphite boats 12. One graphite boat is illustrated and it has a layer 14 of silicon nitride covering and enclosing its entire outer surface. Microwave energy from a suitable source passes into the space 16 within the tube through the passage 18. A quarter wavelength shorting plate 20 for the microwaves is provided in passage 22. A source of gaseous carbon compound is fed into the space 16 in the direction of arrow A.

Located in the recess 24 of the nitride coated boat 12 is a layer 26 of crystalline silicon on top of which is placed a layer 28 of diamond particles. This arrangement ensures that any movement of the diamond particles is minimised. Most of the diamond crystals make some point contact with an adjacent crystal.

Crystalline diamond growth on the seed crystals was produced by creating microwave energy of 2,45 GHz, raising and maintaining the temperature of the graphite boat at 730° C. and the diamond seed crystals at a temperature of about 830° C., and introducing gaseous methane gas in admixture with hydrogen gas (the methane gas constituting 5% of the mixture). These conditions were maintained for a period of five hours during which the crystalline diamond growth was such that diamond bridges were produced between a large number of the diamond crystals producing a bonded polycrystalline diamond mass.

Figure 4:
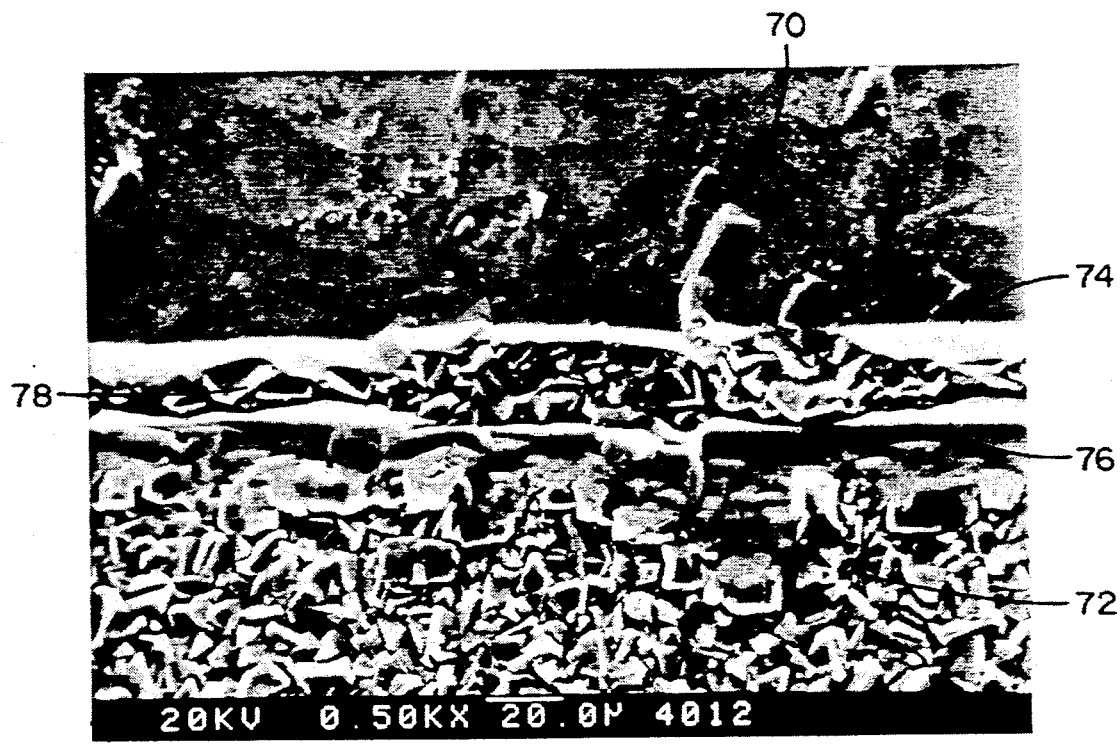
FIG. 4 is a photograph of diamond growth between diamond plates.
Figure 5:
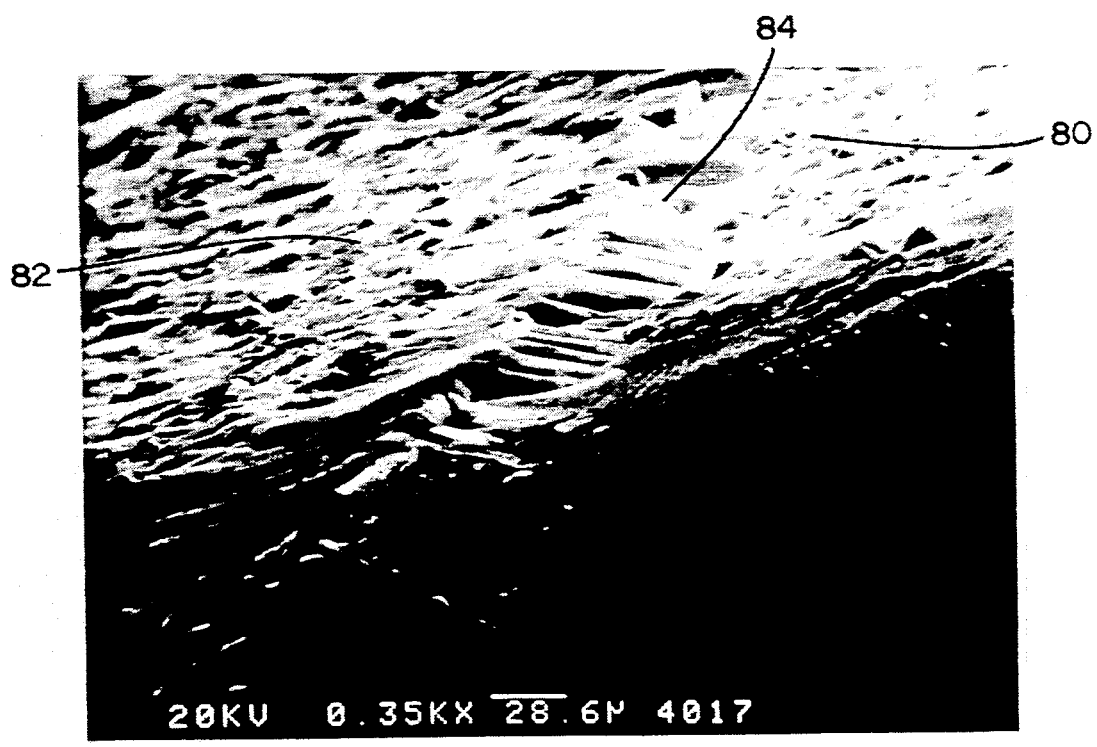
FIG. 5 is a photograph of diamond growth between two other diamond plates.

FIGS. 4 and 5 are photographs of diamond growth or bridges produced between diamond plates. The diamond growth took place in apparatus of the type illustrated by FIG. 3 and using the conditions mentioned above.

Referring first to the FIG. 4 photograph (5000 magnification), the two diamond plates each had an upper surface 70, 72 in the (100) plane. Transverse thereto were surfaces 74, 76, each of which was again in the (100) plane or in within a plane 3° of such a plane. Diamond growth occurred on all four surfaces 70, 72, 74 and 76 at essentially the same rate. The diamond growth which occurred between the surfaces 74 and 76 is indicated by the number 78. It will be noted that the diamond growth was poor and did not completely fill the space provided between the surfaces 74 and 76. Referring now to the FIG. 5 photograph (3500 magnification), a diamond plate was sawn in half providing two pieces each with a major flat surface in the (100) plane and surfaces transverse thereto which were roughened as a result of the sawing. Each roughened surface had a plurality of (111) facets. The (100) planes of the plates are indicated by 80 and 82 and the diamond growth between the plates is indicated by the number 84. The diamond growth 84 is essentially the same as that of the two plates and fills the space completely to the extent that the transverse surfaces of the plates cannot be seen. The joined diamond plates do not differ in quality from a single diamond plate and can be used as a diamond window.

I claim:

1. A method of joining diamond bodies comprising the steps of:
    (a) positioning the bodies such that a surface of one body is close to a surface of the other body and a space is provided therebetween, said surfaces being (111) or (110) planes or planes within 3° of said (111) or (110) planes,
(b) growing diamond on the surfaces by chemical vapour deposition and
(c) continuing the growth until the surfaces are joined by grown diamond.

2. A method of claim 1 wherein the space, from the one surface to the other at its widest point, does not exceed 150 microns.

3. A method of claim 1 wherein the diamond growth is continued until the space is filled with grown diamond.

4. A method of claim 1 wherein the surfaces are roughened providing at least one (111) plane on each surface.

5. A method of claim 1 wherein diamond bodies are diamond plates.

6. A method of claim 5 wherein the diamond plates each have a (100) plane transverse to the surfaces bounding the space.

7. A method of joining diamond plates comprising the steps of:
(a) positioning the plates, each of which has a surface defined by a (100) plane and a surface transverse thereto, such that the transverse surface of one plate is close to the transverse surface of the other plate and provides a space therebetween, each transverse surface being roughened to provide at least one (111) plane or being defined by a (110) plane or a (111) plane,
(b) growing diamond on at least the transverse surfaces, and
(c) continuing the diamond growth until the transverse surfaces are joined by grown diamond.

8. A method according to claim 7 wherein the space, from the one surface to the other at its widest point, does not exceed 150 microns.

9. A method according to claim 7 wherein diamond growth is continued until the space is filled with grown diamond.

10. A method of joining diamond plates comprising the steps of:
(a) positioning the plates, each of which has a surface defined by a (110) plane and a surface transverse thereto, such that the transverse surface of one plate is close to the transverse surface of the other plate and provides a space therebetween, each transverse surface being roughened to provide at least one (111) plane or is defined by a (111) plane,
(b) growing diamond on at least the transverse surfaces, and
(c) continuing the diamond growth until the transverse surfaces are joined by grown diamond.

11. A method according to claim 10 wherein the space, from the one surface to the other at its widest point, does not exceed 150 microns.

12. A method according to claim 10 wherein diamond growth is continued until the space is filled with grown diamond.

* * * * *